United States Patent [19]

Yamamoto et al.

[11] Patent Number: 4,879,579

[45] Date of Patent: Nov. 7, 1989

[54] IMAGE RECORDING APPARATUS

[75] Inventors: Takemi Yamamoto, Nagoya; Kenji Sakakibara, Ichinomiya, both of Japan

[73] Assignee: Brother Kogyo Kabushiki Kaisha, Japan

[21] Appl. No.: 272,722

[22] Filed: Nov. 17, 1988

[30] Foreign Application Priority Data

Nov. 27, 1987 [JP] Japan .................................. 62-301105

[51] Int. Cl.$^4$ ...................... G03G 15/00; G03G 15/01
[52] U.S. Cl. .................................... 355/235; 355/212; 355/220; 355/234; 355/326
[58] Field of Search ............... 355/228, 229, 233, 234, 355/235, 211, 212, 326; 118/645; 430/138, 92, 357

[56] References Cited

U.S. PATENT DOCUMENTS

| | | | |
|---|---|---|---|
| 4,426,149 | 1/1984 | Kuemmel et al. | 355/235 |
| 4,514,080 | 4/1985 | Matsuzawa et al. | 355/235 X |
| 4,571,061 | 2/1986 | Osanai et al. | 355/212 X |
| 4,582,418 | 4/1986 | Kozuka et al. | 355/235 |
| 4,739,231 | 4/1988 | Miyata et al. | 355/235 X |
| 4,757,346 | 7/1988 | Coons et al. | 355/235 |

Primary Examiner—A. C. Prescott
Attorney, Agent, or Firm—Kane, Dalsimer, Sullivan, Kurucz, Levy, Eisele, and Richard

[57] ABSTRACT

An image recording apparatus for recording an image corresponding to image information on an original, onto a photo-sensitive recording medium by a slit scanning exposure system. A resolution controller generates a control signal representative of designated resolution of the image to be recorded on the recording medium. A slit-width adjusting unit is operative in response to the control signal from the resolution controller for adjusting an opening width of a variable exposure slit arranged at an exposure station at which the recording medium is exposed. A scanning-speed adjusting unit is operative in response to the control signal from the resolution controller for adjusting scanning speed at which the original is scanned.

11 Claims, 4 Drawing Sheets

IMAGE RECORDING APPARATUS

BACKGROUND OF THE INVENTION

This invention relates to an image recording apparatus such as an optical printer, a copying machine or the like for recording an image onto a photosensitive recording medium by a slit-scanning exposure system.

Referring to FIG. 1 of the drawings, there is schematically shown a usual or general copying machine for copying image information on an original to a photosensitive recording medium. The copying machine comprises a transparent glass platen 51 movable in a direction indicated by an arrow A. An original 52 having carried thereon image information is placed upon the platen 51. Light from a light source 53 scans the information side of the original 52, while the original 52 as well as the platen 51 is moved in the arrowed direction A. Light reflected by the original 51 is directed toward a photo-sensitive recording medium 54 transported in a direction indicated by an arrow B, so that the recording medium 54 is exposed to the light through a slit 57. The recording medium 54 is then developed by a pressure developing unit 55. For the arrangement illustrated in FIG. 1, it is required that the recording medium 54 is exposed to the light while being maintained horizontal. To this end, in general, a table 56 is provided for enabling the recording medium 54 to rest upon an upper surface of the table 56. The recording medium 54 moves in sliding contact with the upper surface of the table 56.

In the above-described conventional copying machine, it is needless to say that, when a photosensitive recording medium low in photo-sensitivity is used, power of the light source 53 is raised to increase the light quantity to which the recording medium is exposed. If the increased light quantity is concentrated into the slit 57 narrow in width, however, there is such an anxiety that a bad influence is exerted upon the recording medium. Thus, attention is required to be paid to enlarge the width of the slit 57 so as to prevent the light quantity per unit area from increasing excessively.

When the width of the slit 57 is enlarged, however, it is required to considerably enhance the accuracy of the delivery speed at which the original 52 and the recording medium 54 are moved in synchronism with each other. In addition, extremely high accuracy is required for attachment and arrangement of reflecting mirrors, a lens system and so on for leading the light from the light source 53 to a predetermined line on the original 52 and for leading the reflected light from the original 52 to the recording medium 54. Thus, the arrangement of the conventional copying machine is disadvantageous particularly in recording of an image at high resolution.

Further, there are a case where a user desires to quicken the copying speed at normal resolution at which the slit width is normal and the scanning speed is normal, and a case where the user desires to take a copy at high resolution though the copying speed may be slow at which the slit width is small and the scanning speed is slow. It is impossible for the conventional copying machine, however, to fulfill such user's wishes simply.

SUMMARY OF THE INVENTION

It is therefore a object of this invention to provide an improved image recording apparatus enabling a user to select resolution of an image to be recorded onto a photo-sensitive recording medium, in an optional and easy manner.

For the above purpose, according to the invention, there is provided an image recording apparatus for recording an image corresponding to image information on an original, onto a photo-sensitive recording medium by a slit scanning exposure system, which comprises:

selection means for selectively designating resolution of the image to be recorded onto the recording medium;

resolution control means for generating a control signal on the basis of the designated resolution;

slit-width adjusting means operative in response to the control signal from the resolution control means, for adjusting an opening width of a variable exposure slit arranged at an exposure station at which the recording medium is exposed; and scanning-speed adjusting means operative in response to the control signal from the resolution control means, for adjusting scanning speed at which the original is scanned.

BRIEF DESCRIPTION OF THE ACCOMPANYING DRAWINGS

DESCRIPTION OF THE EMBODIMENTS

Figure 1:
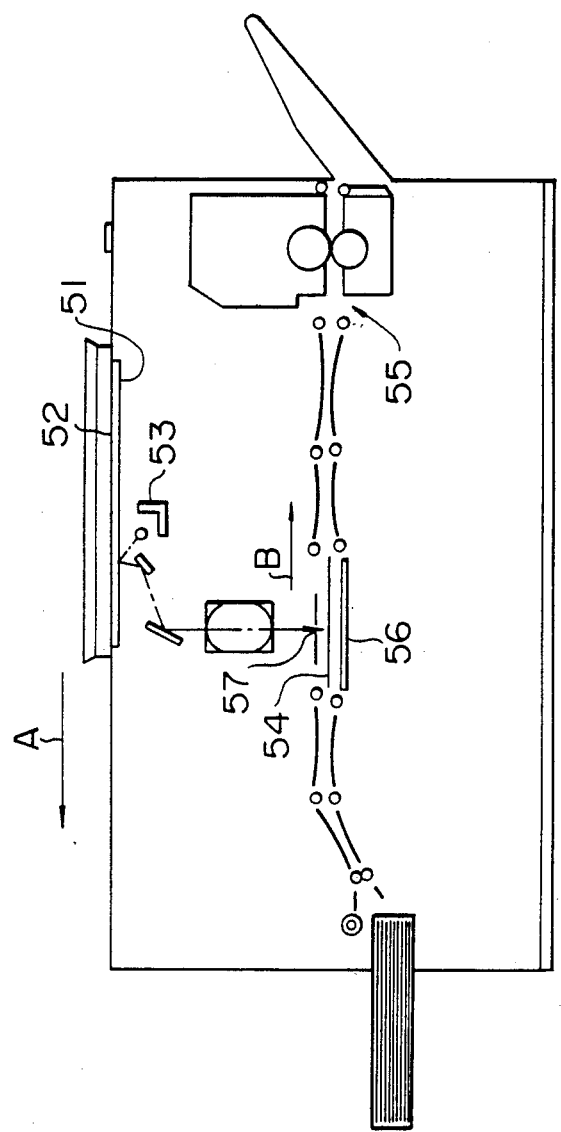
FIG. 1 is a schematic cross-sectional view of a usual or general copying machine.
Figure 2:
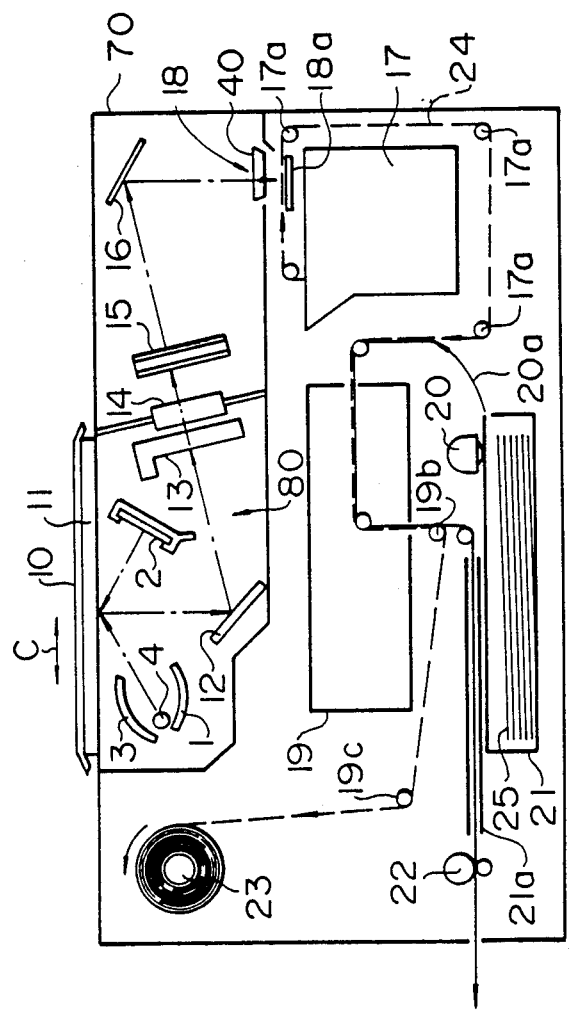
FIG. 2 is a schematic cross-sectional view of an image recording apparatus or a color copying machine embodying the invention.

Referring to FIG. 2, there is schematically shown in cross-section an image recording apparatus or a color copying machine embodying the invention. The copying machine is of type which utilizes a color compatible photo and pressure sensitive recording medium disclosed in U.S. Pat. No. 4,399,209. The recording medium is composed of a continuous web and a developing sheet. The continuous web is coated with microcapsules each containing dye precursor. The developing sheet is coated with developer. It is to be understood, however, that any other suitable photo and pressure sensitive recording media can be employed in the copying machine.

As shown in FIG. 2, the copying machine comprises a body 70. A transparent glass platen 11 is mounted to the top of the body 70 and can be covered with a platen cover 10. An original is set between the platen 11 and the platen cover 10 in such a manner that a side of the original having carried thereon image information faces downwardly. At exposure subsequently to be described, the platen 11 as well as the platen cover 10 is reciprocatively moved together with the original by a scanning motor 68 (see FIG. 4), in a direction indicated by an arrow C in FIG. 2.

An exposure system, generally designated by the reference numeral 80, includes a light source 4 arranged below the platen 11, for emitting light with which the original on the platen 11 is illuminated. A reflector 1 is arranged below the light source 4, and is formed by a cold mirror having such a characteristic that visible radiation is reflected by the cold mirror, but infrared radiation is transmitted through the cold mirror. The reflector 1 has its parabolic cross-sectional shape. A reflector 3 is arranged just above the reflector 1 in facing relation to the same. The reflector 3 is formed by an aluminum mirror, and has a parabolic cross-sectional shape. The light source 4 is arranged between the pair of reflectors 1 and 3 and is located at a focus common to them. A reflector 2 is arranged below the platen 11 and at a location on the right of the light source 4. The reflector 2 is formed by a flat cold mirror for reflecting a part of the light emitted from the light source 4, which is not directed toward the original, and for reflecting only the visible radiation of the light reflected by the reflector 3, to cause the reflected light part and the reflected visible radiation to shine upon the information side of the original. By the reflectors 1, 2 and 3 arranged as above, the light source 4 shines upon a predetermined scanning line on the information side of the original, which extends horizontally and perpendicularly to the arrowed direction C.

When, at exposure subsequently to be described, the platen 11 as well as the platen cover 10 is reciprocatively moved together with the original by the scanning motor 68 in the arrowed direction C, the information side of the original passes successively over the predetermined scanning line illuminated with the light from the light source 4.

Below the predetermined scanning line, a reflecting mirror 12 is arranged for directing the light reflected from the predetermined scanning line, toward a right upper location within the body 70. At a location on the right of the reflecting mirror 12, a shutter 13 is arranged for suitably intercepting or passing the light reflected by the reflecting mirror 12. A lens system 14 is arranged on the right of the shutter 13. On the right of the lens system 14, a filter 15 is arranged for permitting predetermined wavelength components for respective cyan, magenta and yellow, to be transmitted selectively through the filter 15. At a right upper location within the body 70, a reflecting mirror 16 is arranged for reflecting downwardly the light having passed through the filter 15. Arranged below the reflecting mirror 16 is an exposure station 18 where a portion of the aforesaid continuous web 24 is exposed to the light reflected by the reflecting mirror 16. The exposure station 18 includes a table 18a on which the portion of the web 24 rests, and a variable exposure slit assembly 40 arranged above the table 18a for regulating a light exposure to which the portion of the web 24 is exposed.

Figure 3:
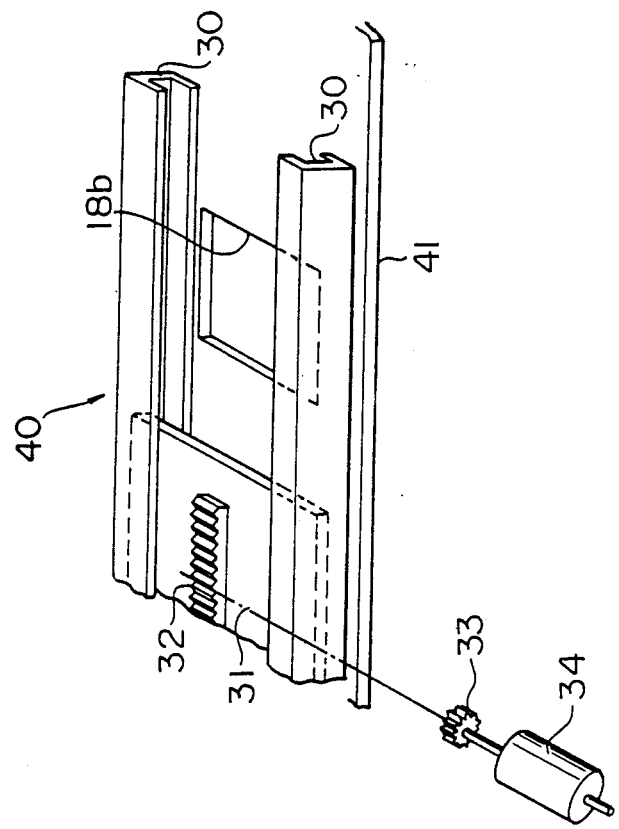
FIG. 3 is a fragmentary enlarged perspective view of a variable exposure slit assembly incorporated in the copying machine illustrated in FIG. 2.

As shown in detail in FIG. 3, the variable exposure slit assembly 40 has a base plate 41 formed therein with an exposure slit 18b. A pair of guide rails 30 are fixedly mounted to an upper surface of the base plate 41 and extend respectively along opposite side edges of the exposure slit 18b in spaced parallel relation to each other. A light-shielding plate 31 has its opposite side edges accommodated respectively in the guide rails 30 for reciprocative movement along the same to adjust an opening width of the exposure slit 18b or an exposure slit width. An elongated rack 32 is mounted to the top of the light-shielding plate 31 in parallel relation to the guide rails 30. A pinion gear 33 is mounterd on an output shaft of a motor 34 for ratation therewith. The pinion gear 33 is in mesh with the rack 32. The arrangement is such that rotation of the motor 34 causes the light-shielding plate 31 to be moved reciprocatively along the guide rails 30, thereby adjusting the opening width of the exposure slit 18b.

Below the exposure station 18, a cartridge or Patrone 17 is arranged for accommodating therein an unused portion of the web 24 wound into a roll. A plurality of web feed rollers 17a are arranged around the web cartridge 17 for feeding the web 24. The feed rollers 17a are drivingly connected to the scanning motor 68 (see FIG. 4). When the feed rollers 17a are rotatively driven by the scanning motor 68, the portion of the web 24 is transported around the cartridge 17 and is conveyed to a pressure developing unit 19 which is arranged on the left of the cartridge 17. When the portion of the web 24 is transported, the original moves together with the platen 11 in synchronism with the transportation of the portion of the web 24. Thus, a latent image corresponding to the image information on the original is formed onto the portion of the web 20 at the exposure station 18.

Below the pressure developing unit 19, a sheet cartridge 21 is arranged which accommodates therein a stack of developing sheets 25 of cut sheet type. Above the sheet cartridge 21, a roller 20 is arranged for drawing the developing sheets 25 one by one out of the sheet cartridge 21. The drawn developing sheet 2 is fed along a sheet feed guide 20a toward the web cartridge 17. The developing sheet 25 is brought into close contact with the portion of the web 24 having carried thereon the latent image. That is, the developing sheet 25 and the web 24 are superimposed one upon the other and are transported toward the pressure developing unit 19 for developing the latent image on the portion of the web 24, onto the developing sheet 25. In this connection, the pressure developing unit 19 employed in the illustrated embodiment has no direct relation to the invention, and the detailed description of the pressure developing unit 19 is therefore omitted here.

The superimposed web and sheet 24 and 25 are transported downwardly out of the pressure developing unit 19, and are separated from each other by a separator roller 19b arranged below the pressure developing unit 19. The thus separated web 24 is transported upwardly by a guide roller 19c arranged on the left of the separator roller 19b. The used portion of the web 24 is wound around a take-up roller 23 arranged at a left upper location within the body 70. On the other hand, the separated developing sheet 25 is transported to the left along a sheet guide 21a arranged above the sheet cartridge 21. On the left of the sheet guide 21a, a heat-fixing unit 22 is arranged for giving a gloss to the developed image formed on the developing sheet 25. The developing sheet 25 having passed through the heat-fixing unit 22 is discharged out of the body 70.

Figure 4:
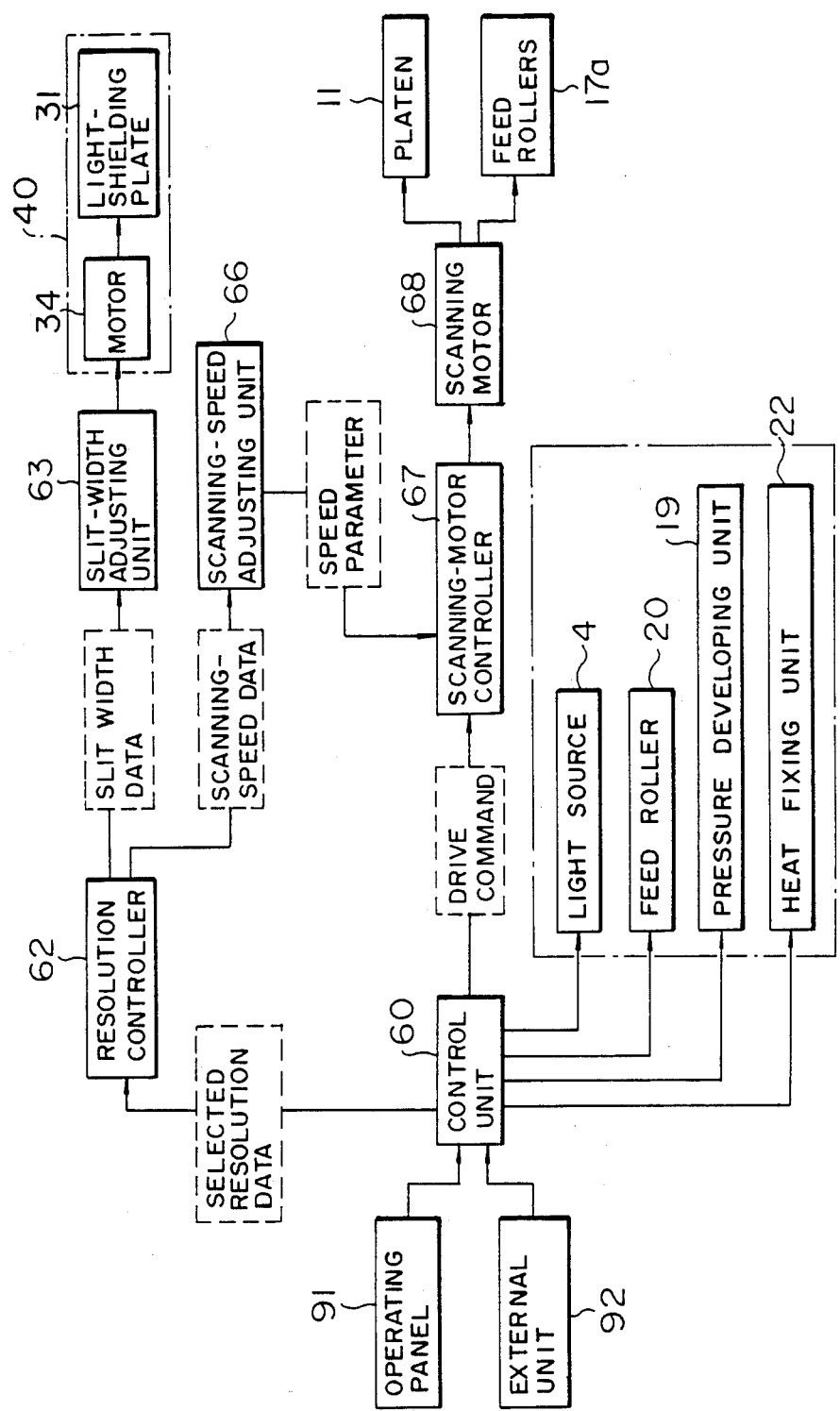
FIG. 4 is a block diagram showing a control system incorporated in the copying machine illustrated in FIG. 2.

Referring to FIG. 4, there is shown in block diagram a control system incorporated in the copying machine illustrated in FIG. 2. The control system has a control unit 60 for controlling the light source 4, the feed roller 20, the pressure-developing unit 19 and the heat-fixing unit 22. The control unit 60 is so designed also as to control the scanning speed of the scanning motor 68 for the platen 11 and the feed rollers 17a, and the opening width of the exposure slit 18b. Control of the scanning speed and the opening width of the exposure slit 18b will be described below with reference to FIG. 4.

The control unit 60 sends selected resolution data inputted thereto from an operating panel 91 or an external unit 92, to a resolution controller 62. On the basis of the selected resolution data, the resolution controller 62 sends slit-width data to a slit-width adjusting unit 63. On the basis of the slit-width data, the slit-width adjusting unit 63 rotates the motor 34 of the variable exposure slit assembly 40 shown in FIG. 3, by a predetermined amount to move the light-shielding plate 31 along the guide rails 30, thereby adjusting the opening width of the exposure slit 18b. Simultaneously with sending of the slit-width data to the slit-width adjusting unit 63, the resolution controller 62 sends scanning-speed data to a scanning-speed adjusting unit 66. On the basis of the scanning-speed data, the scanning-speed adjusting unit 66 sends a speed parameter to a scanning-motor controller 67. In response to a drive command from the control unit 60, the scanning-motor controller 67 controls rotational speed of the aforesaid scanning motor 68 to a value designated by the speed parameter. Thus, the scanning motor 68 moves the platen 11 in the arrowed direction C in FIG. 2, and rotates the feed rollers 17a for the web 24 in synchronism with the movement of the platen 11.

In operation, the external unit 92 designates or a user manipulates the operating panel 91 to designate resolution commands including the following NORMAL and FINE modes.

(1) NORMAL mode

The resolution controller 62 issues a command of normal slit width to the slit-width adjusting unit 63 and also issues a command of normal scanning speed to the scanning-speed adjusting unit 66. In response to the command of normal slit width, the slit-width adjusting unit 63 brings the opening width of the exposure slit 18b to a normal value. On the other hand, in response to the command of normal scanning speed, the scanning-speed adjusting unit 66 sets the scanning speed to a normal value. Thus, the latent image is formed onto the portion of the web 24 at the NORMAL mode in which the resolution is normal and the copying speed is normal.

(2) FINE mode

The resolution controller 62 issues a command of narrow slit width to the slit-width adjusting unit 63 and also issues a command of slow scanning speed to the scanning-speed adjusting unit 66. In response to the command of narrow slit width, the slit-width adjusting unit 63 narrows the opening width of the exposure slit 18b. On the other hand, in response to the command of slow scanning speed, the scanning-speed adjusting unit 66 slows the scanning speed. Thus, the latent image is formed onto the portion of the web 24 at the FINE mode in which the resolution is high and the copying speed is slow.

It is of course that the resolution modes are not limited to the above two levels. That is, the opening width of the exposure slit 18b in the variable exposure slit assembly 40 and the scanning speed of the scanning motor 68 can be adjusted in such multiple step manner that the resolution modes have three or more levels.

Moreover, in the illustrated embodiment, the resolution controller 62, the slit-width adjusting unit 63 and the scanning-speed adjusting unit 66 are provided independently of each other and independently of the control unit 60. However, these components 62, 63, 66 and 60 can be assembled into a single component.

The operation of the copying machine constructed as above will be described below.

When the original placed upon the platen 11 is stationary at an initial position, the light from the light source 4 shines upon the predetermined scanning line on the original through the reflectors 1, 2 and 3. The light reflected by the original is directed to the right by the reflecting mirror 12 and is caused to pass through the shutter 13, the lens system 14 and the filter 15. The light having passed through the filter 15 is reflected downwardly by the reflecting mirror 16. The reflected light is adjusted in light exposure by the variable exposure slit assembly 40, and exposes the portion of the web 24 placed upon the table 18a. When the portion of the web 24 is exposed to the light from the reflecting mirror 16, the opening width of the exposure slit 18b of the variable exposure slit assembly 40 and the scanning speed of the scanning motor 68 for the platen 11 and the feed rollers 17b are set to their respective values in accordance with one of the aforesaid resolution modes which is selected by manipulation of the operating panel 91 or designated by the external unit 92, so that the exposure is carried out on the basis of the selected resolution mode.

As the platen 11 starts to move together with the original and the platen cover 10 in the arrowed direction C, the web 24 starts to be transported by the rollers 17a around the web cartridge 17 in synchronism with the movement of the original.

After completion of the movement of the original, a latent image corresponding to the image information on the original is formed onto the portion of the web 24. The length of the portion of the web 24 arranged around the web cartridge 17 is set to a value at least equal to that of the original placed upon the platen 11. The portion of the web 24 having carried thereon the latent image is superimposed upon the developing sheet 25 drawn out of the sheet cartridge 21 along the sheet guide 20a. The superimposed web and sheet 24 and 25 are fed into the pressure developing unit 19. At the pressure developing unit 19, unexposed brittle microcapsules on the portion of the web 24 are ruptured so that the dye precursors are squeezed out of the ruptured microcapsules. The dye precursors squeezed out of the ruptured microcapsules react with the developer coated on the developing sheet 25 so that the latent image on the web 24 is developed onto the developing sheet 25. Thus, a color image is formed on the developing sheet 25.

The web and developing sheet 24 and 25 discharged out of the pressure developing unit 19 are then separated from each other by the separator roll 19b. The thus separated web 24 is transported upwardly by the guide roller 19c and is wound up around the take-up roller 23. On the other hand, the separated developing sheet 25 is transported to the left and is caused to pass through the heat-fixing unit 22. By passage through the heat-fixing unit 22, color development of the image on the developing sheet 25 is accelerated, and a gloss is given to the image. Subsequently, the developing sheet 25 is discharged out of the body 70.

The embodiment has been described above, which employs the slit-scanning exposure system and which is of type in which the platen 11 is movable. However, the invention is applicable also to type in which the platen is stationary, while the optical system including mirrors and the like is movable. Further, the photosensitive recording medium 24 may be replaced by, for example, a photo-conductive drum or the like.

Further, it is of course that the invention is equally applicable to any other suitable image recording apparatuses such as an optical printer and so on.

As described above in detail, according to the image recording apparatus of the invention, a user can select one of a plurality of resolution modes optionally and simply. That is, for the user's choice, if high resolution is required, the user can select the FINE mode, while if normal resolution is sufficient, the user can select the NORMAL mode. Thus, it is possible to meet various demands of the user easily and inexpensively.

What is claimed is:

1. An image recording apparatus for recording an image corresponding to image information on an original, onto a photo-sensitive recording medium by a slit scanning exposure system, which comprises:

selection means for selectively designating resolution of the image to be recorded onto said recording medium;

resolution control means for generating a control signal on the basis of said designated resolution;

slit-width adjusting means operative in response to said control signal from said resolution control means, for adjusting an opening width of a variable exposure slit arranged at an exposure station at which said recording medium is exposed; and scanning-speed adjusting means operative in response to said control signal from said resolution control means, for adjusting scanning speed at which said original is scanned.

2. The image recording apparatus according to claim 1, wherein said selection means designates a selected one of at least two resolution modes including a NORMAL mode in which the opening width of said exposure slit is set to a normal value and said scanning speed is set to a normal value and a FINE mode in which the opening width of said exposure slit is set to a value smaller than said normal value and said scanning speed is set to a value slower than said normal value.

3. The image recording apparatus according to claim 1, further comprising a variable exposure slit assembly arranged at said exposure station and having a base plate formed therein with said exposure slit and a light-shielding member mounted on said base plate for movement relative thereto, said light-shielding member being associated with said slit-width adjusting means and being moved in response to said control means sent from said resolution control means to said slit-width adjusting means to adjust the opening width of said exposure slit on the basis of said designated resolution, exposure means for directing light to said original to scan the same at said scanning speed adjusted by said scanning-speed adjusting means and for leading the light having scanned said original to said recording medium through said exposure slit of said variable exposure slit assembly, thereby exposing said recording medium to the light having passed through said exposure slit, and drive means for moving said recording medium in synchronism with said scanning speed adjusted by said scanning-speed adjusting means.

4. The image recording apparatus according to claim 3, further comprising a platen on which said original is set, wherein said drive means is drivingly connected also to said platen for moving the same in synchronism with said scanning speed adjusted by said scanning-speed adjusting means.

5. The image recording apparatus according to claim 4, wherein said exposure means includes light source means for emitting the light to scan a predetermined scanning line on said original set on said platen, and wherein said platen is moved by said drive means in such a manner that the original passes successively over said predetermined scanning line.

6. The image recording apparatus according to claim 1, wherein the recording medium includes a continuous web coated with microcapsules each containing dye precursor.

7. An image recording apparatus utilizing a photosensitive recording medium, which comprises:

original support means for supporting an original having carried thereon image information;

an exposure system including light source means for emitting light to scan the original, and optical means for directing the light having scanned the original, toward said recording medium arranged at an exposure station, to expose said recording medium to the light thereby forming a latent image onto said recording medium, the latent image corresponding to the image information on the original;

variable exposure slit means arranged at said exposure station and having a variable exposure slit and movable light-shielding means associated with said exposure slit for adjusting an opening width thereof, wherein the light having scanned the original passes through said exposure slit to expose said recording medium thereby forming said latent image onto said recording medium;

means for developing the latent image on the recording medium; and a control system including selection means for selectively designating resolution of the image to be recorded on said recording medium resolution control means connected to said selection means for generating a slit-width signal and a scanning-speed signal on the basis of said designated resolution, slit-width adjusting means connected to said resolution control means and to said movable light-shielding means of said variable exposure slit means, said slit-width adjusting means being operative in response to said slit-width signal from said resolution control means to move said movable light-shielding means thereby adjusting the opening width of said exposure slit on the basis of said designated resolution, and scanning-speed adjusting means connected to said resolution control means, said scanning-speed adjusting means being operative in response to said scanning-speed signal from said resolution control means to adjust, on the basis of said designated resolution, scanning speed at which said original is scanned by the light from said light source means.

8. The image recording apparatus according to claim 7, further comprising drive means for moving said recording medium in synchronism with said scanning speed adjusted by said scanning-speed adjusting means.

9. The image recording apparatus according to claim 8, wherein said drive means is drivingly connected also to said original support means for moving the same in synchronism with said scanning speed adjusted by said scanning-speed adjusting means, and wherein the light from said light source means scans a predetermined scanning line on the original set on said original support means, said original support means being moved by said drive means in such a manner that the original passes successively over said predetermined scanning line.

10. The image recording apparatus according to claim 7, wherein said selection means designates a selected one of at least two resolution modes including a NORMAL mode in which the opening width of said exposure slit is set to a normal value and said scanning speed is set to a normal value and a FINE mode in which the opening width of said exposure slit is set to a value smaller than said normal value and said scanning speed is set to a value slower than said normal value.

11. The image recording apparatus according to claim 7, wherein the recording medium includes a continuous web coated with microcapsules each containing dye precursor.

* * * * *